(12) United States Patent
Hiratsuka et al.

(10) Patent No.: US 9,507,905 B2
(45) Date of Patent: Nov. 29, 2016

(54) STORAGE MEDIUM STORING CIRCUIT BOARD DESIGN ASSISTANCE PROGRAM, CIRCUIT BOARD DESIGN ASSISTANCE METHOD, AND CIRCUIT BOARD DESIGN ASSISTANCE DEVICE

(71) Applicant: FUJITSU LIMITED, Kawasaki-shi, Kanagawa (JP)

(72) Inventors: Yoshiaki Hiratsuka, Ota (JP); Kenji Nagase, Yokohama (JP); Tomoyuki Nakao, Yokohama (JP); Yoshihiro Sawada, Inagi (JP); Keisuke Nakamura, Tachikawa (JP)

(73) Assignee: FUJITSU LIMITED, Kawasaki (JP)

( * ) Notice: Subject to any disclaimer, the term of this patent is extended or adjusted under 35 U.S.C. 154(b) by 6 days.

(21) Appl. No.: 14/611,326

(22) Filed: Feb. 2, 2015

(65) Prior Publication Data
US 2015/0278422 A1    Oct. 1, 2015

(30) Foreign Application Priority Data

Mar. 31, 2014   (JP) ................ 2014-072085

(51) Int. Cl.
*H02J 7/00*       (2006.01)
*G06F 17/50*      (2006.01)

(52) U.S. Cl.
CPC ....... *G06F 17/5077* (2013.01); *G06F 17/5081* (2013.01)

(58) Field of Classification Search
CPC .......... G06F 17/5036; G06F 17/5081; G06F 17/5077; G06F 2217/82; G06F 17/5045; G06F 17/5072; G06F 3/046; H05K 2201/093
See application file for complete search history.

(56) References Cited

U.S. PATENT DOCUMENTS

| 2007/0044062 A1* | 2/2007 | Fusayasu ............ G06F 17/5077 716/115 |
| 2008/0052020 A1* | 2/2008 | Hsu ...................... G06F 17/5081 702/71 |
| 2012/0192140 A1 | 7/2012 | Sadamatsu et al. |

FOREIGN PATENT DOCUMENTS

| JP | 2003-196340 | 7/2003 |
| JP | 2009-146271 | 7/2009 |
| JP | 2012-155489 | 8/2012 |

OTHER PUBLICATIONS

Patent Abstracts of Japan, Publication No. 2003-196340, published Jul. 11, 2003.
Patent Abstracts of Japan, Publication No. 2009-146271, published Jul. 2, 2009.
Patent Abstracts of Japan, Publication No. 2012-155489, published Aug. 16, 2012.

* cited by examiner

*Primary Examiner* — Nha Nguyen
(74) *Attorney, Agent, or Firm* — Staas & Halsey LLP

(57) ABSTRACT

A non-transitory recording medium storing a program that causes a computer to execute a circuit board design assistance process. The circuit board design assistance process includes: extracting, from design information of a multilayer circuit board in which a plurality of layers are layered, a plurality of ground patterns in the multilayer circuit board that are within a predetermined distance from a path of a signal that flows in the multilayer circuit board; resolving a region at which the plurality of ground patterns are electronically separated as being a discontinuity region; and displaying the resolved discontinuity region.

8 Claims, 19 Drawing Sheets

FIG.13

| LAYER | LINE INFORMATION | PATH SEQUENCE |
|---|---|---|
| FIRST LAYER | pi1—Net1—Vi1 | 1 |
| | Vi4—Net2—pi4 | 6 |
| | pi5—Net3—Vi5 | 7 |
| | Vi6—Net3—pi6 | 9 |
| THIRD LAYER | Vi2—Net2—Vi3 | 4 |
| SEVENTH LAYER | Vi3—Net2—Vi4 | 5 |
| NINTH LAYER | Vi5—Net3—Vi6 | 8 |
| TENTH LAYER | Vi1—Net1—pi2 | 2 |
| | pi3—Net2—Vi2 | 3 |

68H

STORAGE MEDIUM STORING CIRCUIT BOARD DESIGN ASSISTANCE PROGRAM, CIRCUIT BOARD DESIGN ASSISTANCE METHOD, AND CIRCUIT BOARD DESIGN ASSISTANCE DEVICE

CROSS-REFERENCE TO RELATED APPLICATION

This application is based upon and claims the benefit of priority of the prior Japanese Patent Application No. 2014-072085, filed on Mar. 31, 2014, the entire contents of which are incorporated herein by reference.

FIELD

The disclosed technology relates to a storage medium storing a circuit board design assistance program, a circuit board design assistance method, and a circuit board design assistance device.

BACKGROUND

A design processing system such as a computer-aided design (CAD) system or the like is used in the design of circuit boards such as printed circuit boards and the like. It has become usual for arrangements of wiring and the like to be determined with consideration for the positions and sizes of components to be mounted on the circuit boards. As the signal clocks of electronic equipment become faster, it is also common to design circuit boards with consideration for the generation of electromagnetic field noise.

For example, the signal waveform of a high-speed signal clock may be distorted by electromagnetic field noise emitted by electronic equipment, and this distortion may affect operations. Electromagnetic field noise is caused by currents flowing in loops formed by combinations of the paths of currents flowing as signals and the paths of return currents flowing to ground. A field intensity causing electromagnetic field noise tends to be larger when the area of a loop is larger. Therefore, electromagnetic field noise may be suppressed by reducing the areas of the loops. Thus, electromagnetic field noise may be suppressed by keeping the paths of currents that flow as signals and the paths of return currents close together.

A number of technologies that suppress electromagnetic field noise in circuit boards are known. For example, a technology is known in which overlap regions are found, in which regions whose widths are the width of a target signal line magnified to a pre-specified width overlap with ground patterns, detour paths are found for discontinuity portions of the overlap regions, and the suitability of the paths of return currents is judged. Another technology is known that evaluates the acceptability of a printed circuit board design, with the path of a return current being defined by the shortest paths joining vias on a signal line with vias that connect ground patterns within a certain distance from the signal line. Still another technology is known that extracts vias connecting the ground patterns of a target signal with ground patterns in adjacent layers and that, where the path of the return current is broken, finds a detour through the vias.

RELATED PATENT DOCUMENTS

Japanese Patent Application Laid-Open (JP-A) No. 2003-196340
JP-A No. 2009-146271
JP-A No. 2012-155489

SUMMARY

According to an aspect of the embodiments, a non-transitory recording medium stores a program that causes a computer to execute a circuit board design assistance process. The circuit board design assistance process includes: extracting, from design information of a multilayer circuit board in which a plurality of layers are layered, a plurality of ground patterns in the multilayer circuit board that are within a predetermined distance from a path of a signal that flows in the multilayer circuit board; resolving a region at which the plurality of ground patterns are electronically separated as being a discontinuity region; and displaying the resolved discontinuity region.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is a schematic diagram illustrating an example of line information;

DESCRIPTION OF EMBODIMENTS

Herebelow, an example of an embodiment of the disclosed technology is described in detail, referring to the attached drawings.

Figure 1:
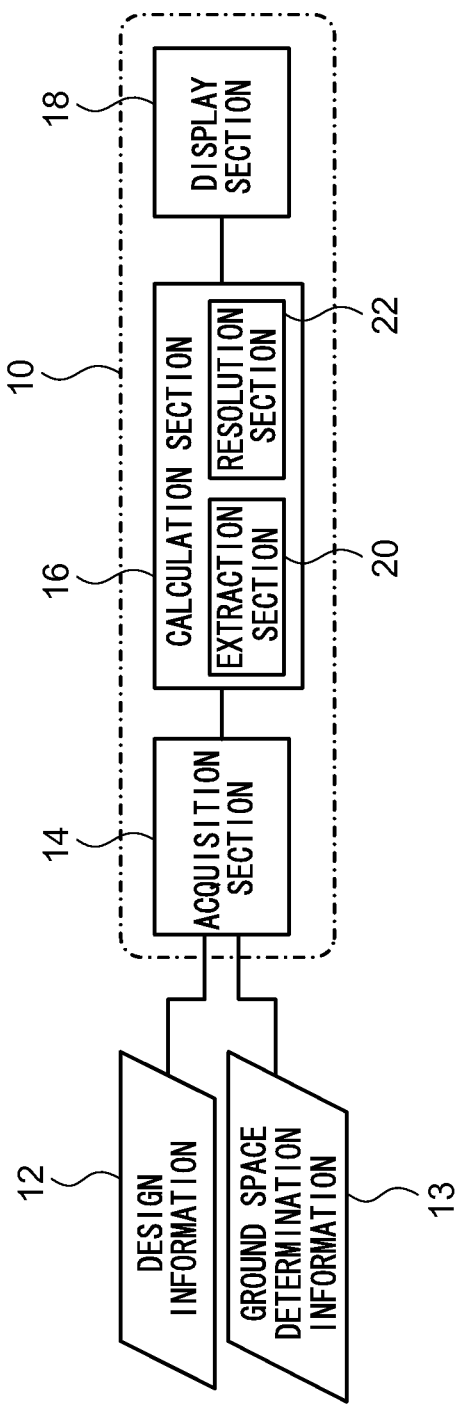
FIG. 1 is a block diagram illustrating an example of a circuit board design assistance device.

FIG. 1 illustrates an example of a circuit board design assistance device 10 according to the present exemplary embodiment. The circuit board design assistance device 10 extracts, from design information of a multilayer circuit board in which a plural number of layers are layered, plural ground patterns in the multilayer circuit board that are within a predetermined distance from the path of a signal that flows in the multilayer circuit board. The circuit board design assistance device 10 resolves regions at which the plural ground patterns are electronically separated as being discontinuity regions, and displays the resolved discontinuity regions. That is, design information 12 of the multilayer circuit board in which the plural layers are layered and ground space determination information 13 are inputted to the circuit board design assistance device 10 from a design processing system such as a CAD system or the like. The circuit board design assistance device 10 is equipped with an acquisition section 14, a calculation section 16 and a display section 18. The calculation section 16 includes an extraction section 20 and a resolution section 22.

The acquisition section 14 acquires the inputted design information 12 and ground space determination information 13. The design information 12 includes information representing the paths of signals flowing in the multilayer circuit board in which the plural layers are layered, ground patterns, and the start points and end points of paths along which return currents relating to the paths of the signals are to flow. The ground space determination information is information for extracting, from the design information of the multilayer circuit board in which the plural layers are layered, plural ground patterns in the multilayer circuit board that are within a predetermined distance of the path of a signal flowing in the multilayer circuit board. For example, the ground space determination information is information that prescribes the positions and shapes of a ground space within the multilayer circuit board, in which ground space a path along which a return current flows relative to the path of a target signal is to be permitted. The target signal is designated from among the paths of signals included in the design information.

The information representing ground patterns represents plan view shapes and disposition layers of the ground patterns provided in arbitrary layers within the multilayer circuit board. The design information includes, for example, information representing the positions and connection layers of ground vias that connect between the layers in the multilayer circuit board. The ground space determination information represents the positions and shapes of ground spaces. Ground spaces represent spaces within the multilayer circuit board in which paths along which return currents flow relating to the paths of signals flow are to be permitted. For example, a ground space represents a space within the multilayer circuit board in which a plan view range prescribed in plan view directions of the ground patterns relative to a path of a signal extends across a range prescribed in the layer direction relative to the path of the signal. Thus, the ground space determines, for the path of a signal, the positions and shapes of a ground space in accordance with a range in the plan view directions of the multilayer circuit board and a range in the layer direction of the multilayer circuit board.

On the basis of the inputted design information 12 of the multilayer circuit board and the ground space determination information 13, the extraction section 20 included in the calculation section 16 extracts regions contained within the ground space from the ground patterns in the multilayer circuit board, to serve as defined regions. The resolution section 22 included in the calculation section 16 resolves regions at which the plural ground patterns are electronically separated as being discontinuity regions. That is, on the basis of the design information, the resolution section 22 resolves regions that are electronically separated from defined regions that are electronically connected with the start point of a path along which a return current flows and from defined regions that are electronically connected with the end point of the path along which the return current flows as being discontinuity regions.

The display section 18 displays the discontinuity regions resolved by the resolution section 22. By displaying the discontinuity regions that are electronically separated from the defined regions in which the path along which a return current flows is permitted, the circuit board design assistance device 10 displays regions that are predicted to cause occurrences of electromagnetic field noise. A designer (hereinafter, "the user") identifies positions in the multilayer circuit board that are predicted to cause occurrences of electromagnetic field noise by seeing the displayed discontinuity regions and, with consideration for the displayed discontinuity regions, designs a multilayer circuit board in which electromagnetic field noise is suppressed. Thus, the circuit board design assistance device 10 assists the design of a multilayer circuit board in which electromagnetic field noise originating in the multilayer circuit board is suppressed, by displaying discontinuity regions that are electronically separated from the defined regions in which paths along which return currents flow are permitted.

The circuit board design assistance device 10 is an example of the circuit board design assistance device according to the disclosed technology, and the acquisition section 14 is an example of an acquisition section according to the disclosed technology. The extraction section 20 is an example of an extraction section according to the disclosed technology, the resolution section 22 is an example of a resolution section according to the disclosed technology, and the display section 18 is an example of a display section according to the disclosed technology.

Figure 2:
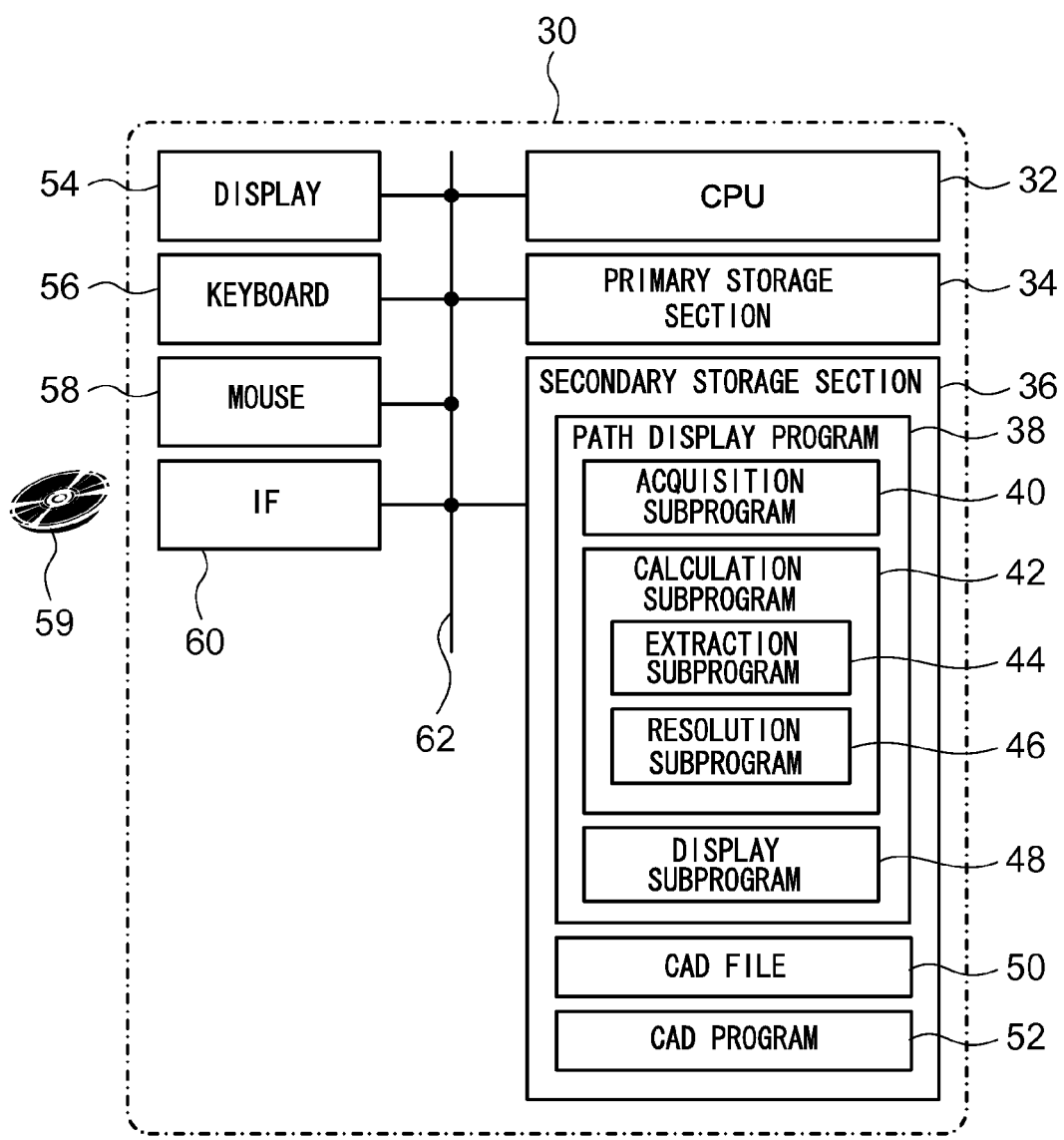
FIG. 2 is a block diagram illustrating an example of the circuit board design assistance device being realized by a computer.

FIG. 2 illustrates an example in which the circuit board design assistance device 10 is realized by a computer 30. The computer 30 includes a CPU 32, a primary storage section 34 and a secondary storage section 36. The CPU 32, the primary storage section 34 and the secondary storage section 36 are connected to one another through a bus 62. The computer 30 also includes a display 54, a keyboard 56 and a mouse 58. The display 54, the keyboard 56 and the mouse 58 are connected to one another through the bus 62. An interface (IF) 60 is also connected to the bus 62. A recording medium 59 is inserted at the interface 60, and the interface 60 includes functions for reading and writing at the inserted recording medium 59. The interface 60 is provided with functions for connecting to a computer network or the like. Here, the secondary storage section 36 is realized by a non-volatile storage medium such as a hard disk drive (HDD), flash memory or the like.

A path display program 38 is memorized in the secondary storage section 36. The path display program 38 is an example of a circuit board display assistance program for causing the computer 30 to function as the circuit board design assistance device 10. The path display program 38 includes an acquisition subprogram 40, a calculation subprogram 42 and a display subprogram 48. The calculation subprogram 42 includes an extraction subprogram 44 and a resolution subprogram 46. The CPU 32 reads the path display program 38 from the secondary storage section 36 and loads the path display program 38 into the primary storage section 34. The CPU 32 sequentially executes the subprograms included in the path display program 38, and the computer 30 operates as the circuit board design assistance device 10 illustrated in FIG. 1. When the CPU 32 executes the acquisition subprogram 40, the computer 30 operates as the acquisition section 14 illustrated in FIG. 1. When the CPU 32 executes the extraction subprogram 44 included in the calculation subprogram 42, the computer 30 operates as the extraction section 20 illustrated in FIG. 1, and when the CPU 32 executes the resolution subprogram 46, the computer 30 operates as the resolution section 22 illustrated in FIG. 1. When the CPU 32 executes the display subprogram 48, the computer 30 operates as the display section 18 illustrated in FIG. 1.

A CAD program 52 is also memorized in the secondary storage section 36. The CAD program 52 is for causing the computer 30 to function as a design processing system such as a CAD system or the like that is used when a circuit board such as a printed circuit board or the like is being designed. A CAD file 50 is also stored in the secondary storage section 36. The CAD file 50 is created by the computer 30 functioning as the design processing system and serves as the design information 12.

In the present exemplary embodiment, an example in which the circuit board design assistance device 10 is realized by the computer 30 is illustrated. However, the circuit board design assistance device 10 is not limited to being realized by the computer 30 alone. For example, the computer 30 serving as the circuit board design assistance device 10 may be configured to be connectable to a computer network and to acquire one or both of the CAD file 50 and the path display program 38 from external equipment. Further, one or both of the path display program 38 and the CAD file 50 may be saved in the recording medium 59 and read by the interface 60.

Figure 3:
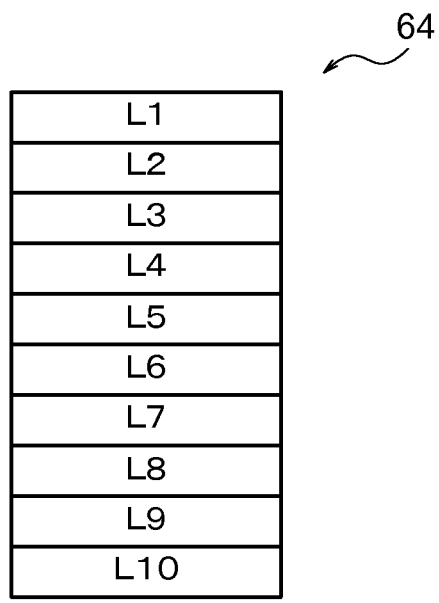
FIG. 3 is a schematic diagram illustrating an example of a multilayer circuit board.

FIG. 3 illustrates a multilayer circuit board 64 in which ten layers are layered, which is an example of a multilayer circuit board to which the disclosed technology is applicable. At least one of a signal line pattern, a ground pattern and a power supply line pattern is arranged in each layer. In the present exemplary embodiment, an example of the multilayer circuit board 64 is described in which each of a first layer (L1), a third layer (L3), a seventh layer (L7), a ninth layer (L9) and a tenth layer (L10) is a layer in which a signal line pattern and a ground pattern are arranged. Moreover, in the present exemplary embodiment an example of the multilayer circuit board 64 is described in which each of a second layer (L2), a fourth layer (L4), a fifth layer (L5), a sixth layer (L6) and an eighth layer (L8) is a layer in which a power supply line pattern is arranged.

In the present exemplary embodiment, as information representing the multilayer circuit board 64, information representing the layer numbers and the different patterns arranged in each layer is included in the CAD file 50 that serves as the design information 12. As the information representing the different patterns, information representing at least one of a signal line pattern, a ground pattern and a power supply line pattern is included in the design information 12 in association with each layer. The CAD file 50 also includes information representing devices, including drivers, receivers and components, information representing signals, information representing paths of the signals, information representing signal line patterns, and information representing ground patterns. The information representing ground patterns includes information representing the shapes of the ground patterns, to which types of ground are assigned as attribute information. In the present exemplary embodiment, as an example of types of ground used during the design of the multilayer circuit board 64, a case is described in which three types of ground are included—digital ground, analog ground and frame ground.

FIG. 4A to FIG. 4E illustrate examples of ground patterns 66 that are included in the multilayer circuit board 64. In the descriptions below, the ground pattern 66 in layer "k" is denoted, in accordance with the ground type "m" and information representing a number "n", by Lkmn. The types of ground are assigned to each ground pattern 66 as attribute information. A digital ground is denoted by "D", an analog ground is denoted by "A" and a frame ground is devoted by "F". For example, a digital ground in the ground pattern 66 of the first layer is denoted L1D1.

Figure 4A:
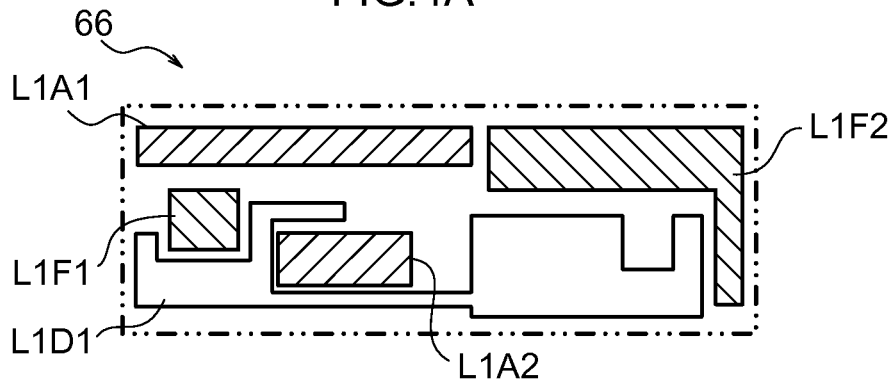
FIG. 4A, FIG. 4B, FIG. 4C, FIG. 4D and FIG. 4E are schematic diagrams illustrating examples of ground patterns.
Figure 4B:
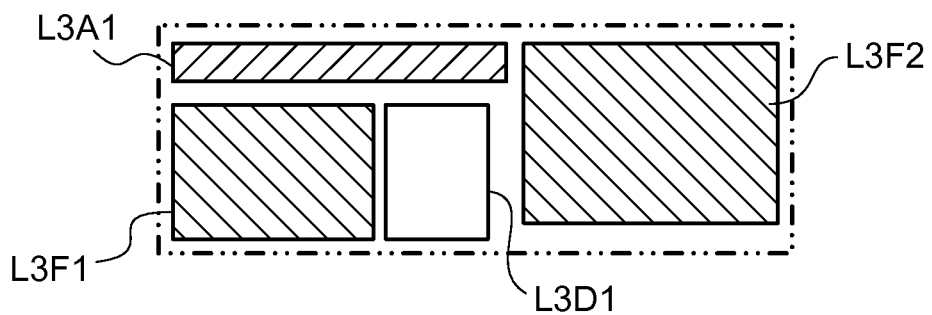
Figure 4C:
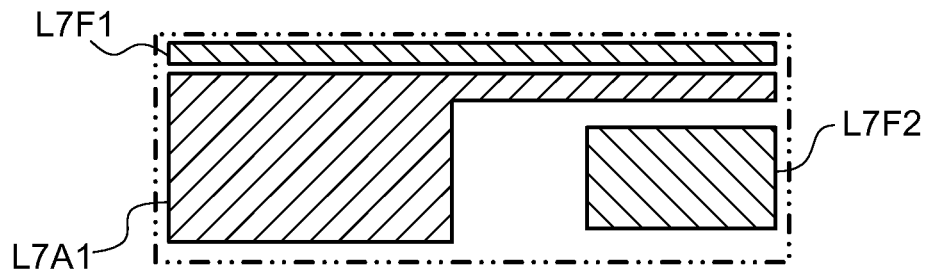
Figure 4D:
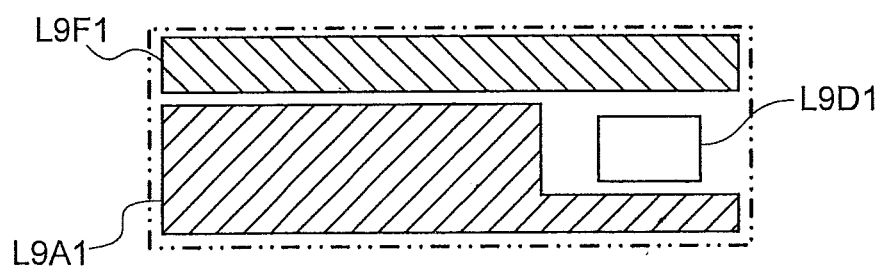
Figure 4E:
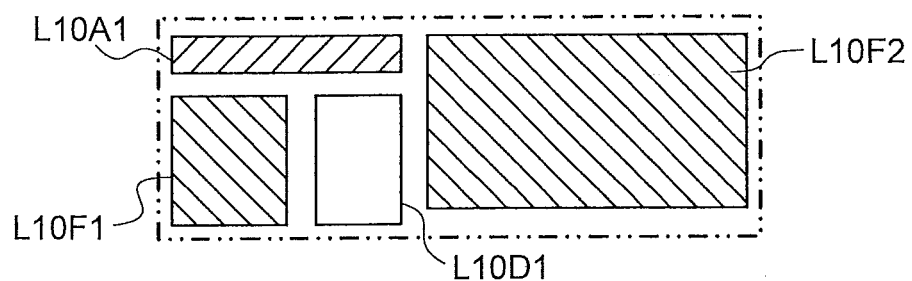

In the example illustrated in FIG. 4A, the ground pattern 66 of the first layer includes a digital ground pattern L1D1, analog ground patterns L1A1 and L1A2, and frame ground patterns L1F1 and L1F2. In the example illustrated in FIG. 4B, the ground pattern 66 of the third layer includes a digital ground pattern L3D1, an analog ground pattern L3A1, and frame ground patterns L3F1 and L3F2. In the example illustrated in FIG. 4C, the ground pattern 66 of the seventh layer includes an analog ground pattern L7A1 and frame ground patterns L7F1 and L7F2. In the example illustrated in FIG. 4D, the ground pattern 66 of the ninth layer includes a digital ground pattern L9D1, an analog ground pattern L9A1, and a frame ground pattern L9F1. In the example illustrated in FIG. 4E, the ground pattern 66 of the tenth layer includes a digital ground pattern L10D1, an analog ground pattern L10A1, and frame ground patterns L10F1 and L10F2.

The types of ground used during the design of the multilayer circuit board 64 are not limited to these three types, digital ground, analog ground and frame ground. Alternative grounds such as, for example, audio ground and the like may be included.

Figure 5:
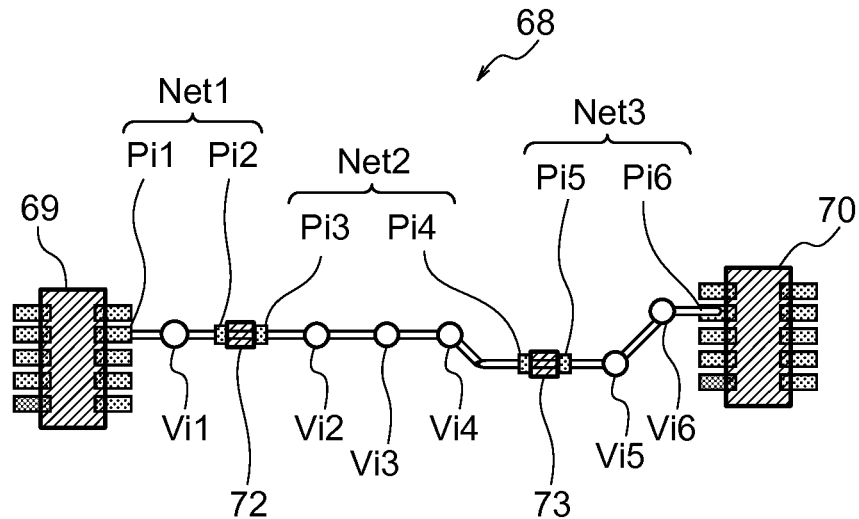
FIG. 5 is a schematic diagram illustrating an example of a signal line.

FIG. 5 illustrates, as an example of a signal path, a signal path 68 of a signal for which current flows from a driver 69 to a receiver 70 through vias and through components 72 and 73. That is, the signal path 68 includes a path along which current flows from a terminal Pi1 of the driver 69 through a via Vi1 to a terminal Pi2 of the component 72. The signal path 68 further includes a path along which current flows from a terminal Pi3 of the component 72 through vias Vi2, Vi3 and Vi4 to a terminal Pi4 of the component 73. The signal path 68 still further includes a path along which current flows from a terminal Pi5 of the component 73 through vias Vi5 and Vi6 to a terminal Pi6 of the receiver 70.

Information representing the paths between terminals, including vias, is recorded in the CAD file 50 as line information 68H (see FIG. 13), which includes net information Net that represents conduction-capable lines in the multilayer circuit board 64. That is, ranges in which conduction is possible along lines that only include vias, in sequence from the side at which the driver 69 is disposed, constitute single records of the net information Net. For example, information representing the path from the terminal Pi1 of the driver 69 through the via Vi1 to the terminal Pi2 of the component 72 includes net information Net1, which represents a conduction-capable line. Information representing the path from the terminal Pi3 of the component 72 through the vias Vi2, Vi3 and Vi4 to the terminal Pi4 of the component 73 includes net information Net2, and information representing the path from the terminal Pi5 of the component 73 through the vias Vi5 and Vi6 to the terminal Pi6 of the receiver 70 includes net information Net3. As illustrated by the example in FIG. 13, for example, the terminal Pi1 of the driver 69 is wired to the via Vi1, and the line information 68H records the information "Pi1-Net1-Vi1" as line information.

Figure 6:
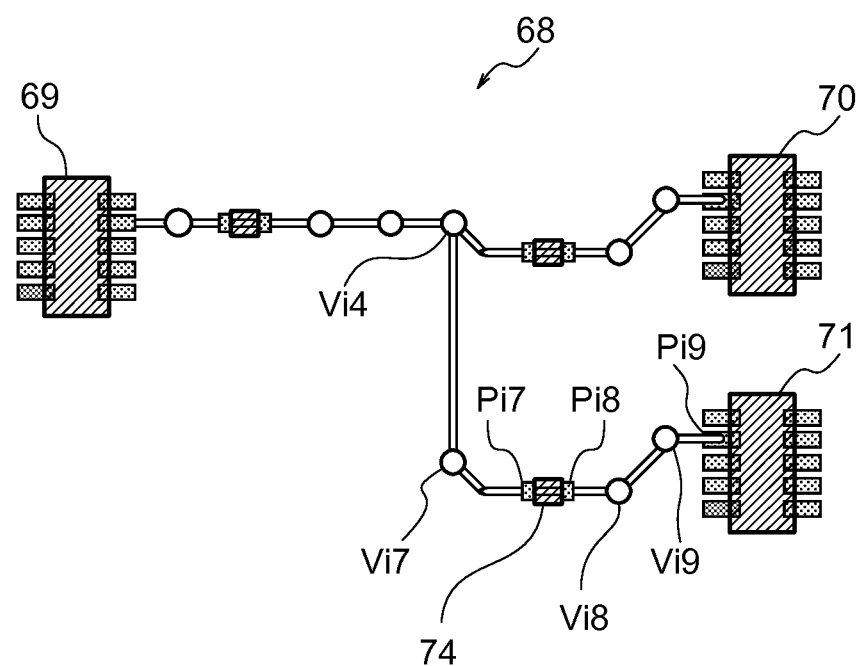
FIG. 6 is a schematic diagram illustrating an alternative example of a signal line.

FIG. 6 illustrates, as an alternative example of a signal path, a signal path that branches partway along the signal path illustrated in FIG. 5 along which current flows from the driver 69 to the receiver 70, to which a signal path through which current flows to a receiver 71 is added. That is, in the signal path 68 shown in FIG. 6, the signal path 68 shown in FIG. 5 branches after the via Vi4, and a path along which current flows through a via Vi7 to a terminal Pi7 of a component 74 is added. Then, in the signal path 68 shown in FIG. 6, a path along which current flows from a terminal Pi8 of the component 74 through vias Vi8 and Vi9 to a terminal Pi9 of the receiver 71 is added.

In the present exemplary embodiment, a case is described in which signal line patterns and ground patterns are disposed in the same layers. However, the disclosed technology is not limited to signal line patterns and ground patterns being disposed in the same layers. For example, any of a power supply line pattern, a signal line pattern and a ground pattern may be disposed in each layer. Furthermore, combinations of patterns that are disposed in the same layer are not limited to signal line patterns and ground patterns. For example, two or more of a power supply line pattern, a signal line pattern and a ground pattern may be combined and disposed in the same layer. Furthermore, in the present exemplary embodiment, an example of the multilayer circuit board 64 is described from which insulating layers are omitted, but insulating layers may be included in the multilayer circuit board 64.

Now, operation of the present exemplary embodiment is described.

By performing analysis with an analysis function included in the CAD program 52 or an analysis device, or by performing testing, the user designing the multilayer circuit board 64 may identify target signals for which the paths of return signals are to be verified. That is, the target signals of return current paths that might induce electromagnetic field noise may be identified in advance by the user. Further, the user may empirically identify distances from the paths of target signals of the paths along which the return currents flow differently in accordance with different types of target signal. In the present exemplary embodiment, the user designates a target signal, and enters a space, relative to the path of the designated target signal, in which the path along which the return current flows is to be permitted. That is, by entering a distance from the signal path of the target signal in a direction orthogonal to the direction in which the target signal flows, the user prescribes a space in which the path along which the return current flows is to be permitted, to suppress electromagnetic field noise. In the present exemplary embodiment, the design of the multilayer circuit board is assisted by the display of discontinuity regions of ground patterns that are associated with the suppression of electromagnetic field noise within the prescribed ground space. As a result, the user may easily recognize regions that are associated with occurrences of electromagnetic field noise and design a multilayer circuit board that suppresses occurrences of electromagnetic field noise.

Figure 7:
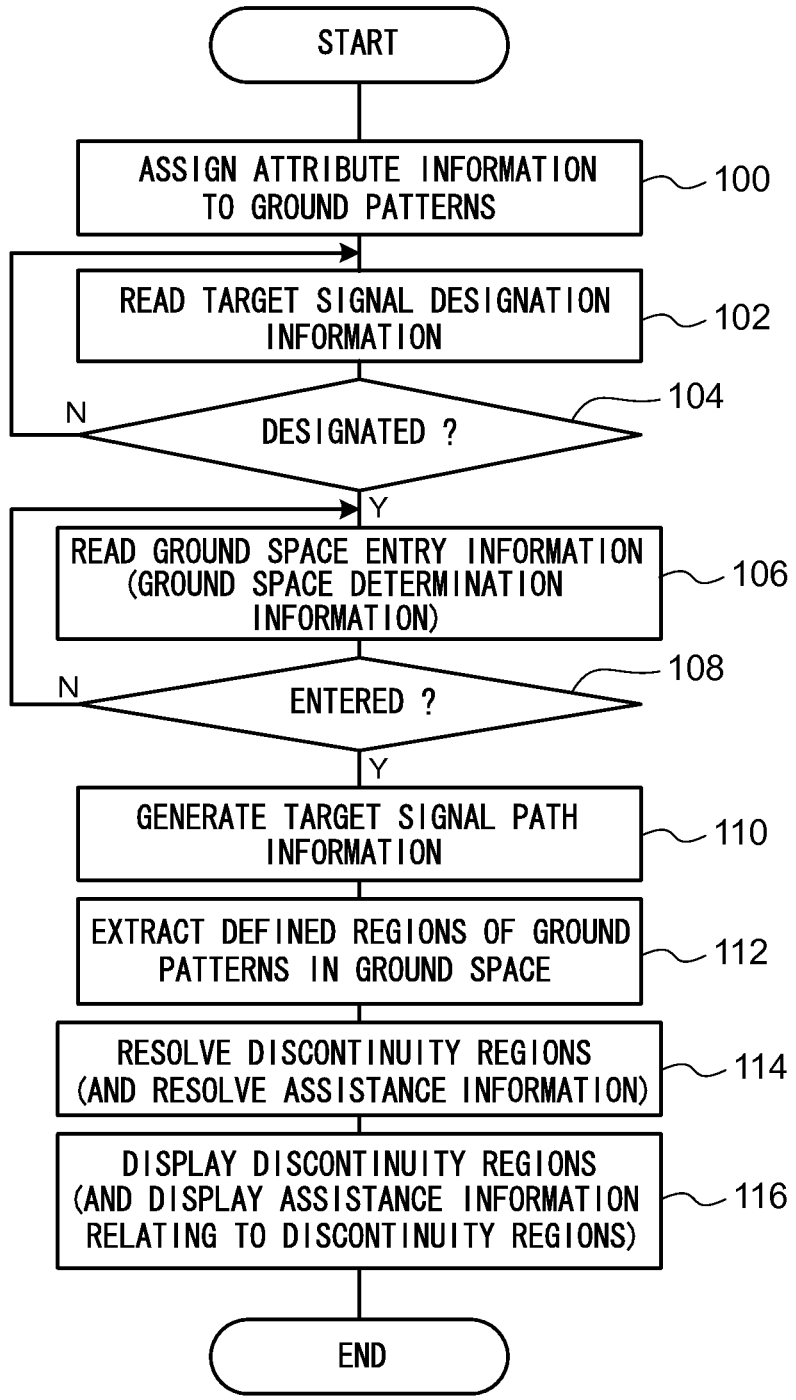
FIG. 7 is a flowchart illustrating an example of the flow of multilayer circuit board design assistance processing.

FIG. 7 illustrates an example of the flow of multilayer circuit board design assistance processing. The multilayer circuit board design assistance processing illustrated in FIG. 7 includes processing by the path display program 38 being executed, which is an example of the multilayer circuit board design assistance program according to the disclosed technology.

When the CPU 32 executes the multilayer circuit board design assistance processing, in step 100, attribute information representing the types of ground is assigned to each of the ground patterns 66 included in the respective layers (see FIG. 4A to FIG. 4E). In the processing of step 100, the CPU 32 assigns the attribute information representing the types of ground to the information representing the designed ground patterns 66. The processing of step 100 may partially include processing by the CAD program 52, or the CPU 32 may execute the processing that assigns the attribute information separately.

Then, the CPU 32 executes the acquisition subprogram 40 by executing the processing of step 102 to step 108. First, in step 102, the CPU 32 acquires the CAD file 50 and reads, from information representing signals in the multilayer circuit board 64, designation information that represents the designation of a target signal. The CPU 32 makes a determination in step 104 and returns to step 102 until a target signal is designated.

Figure 8:
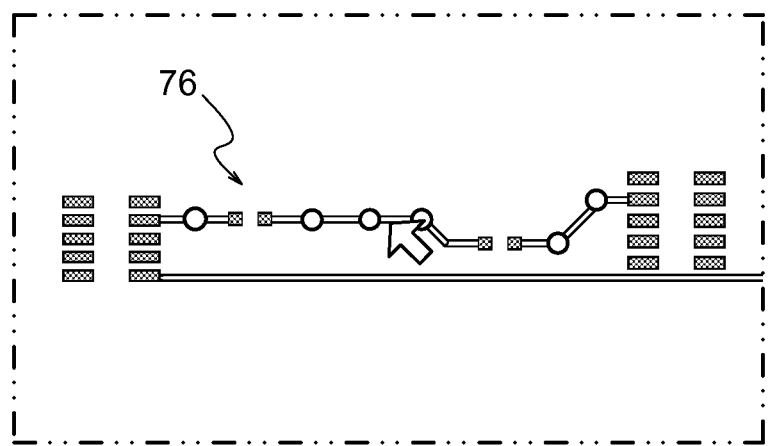
FIG. 8 is a schematic diagram illustrating an example of a case in which a signal line pattern is displayed.
Figure 9:
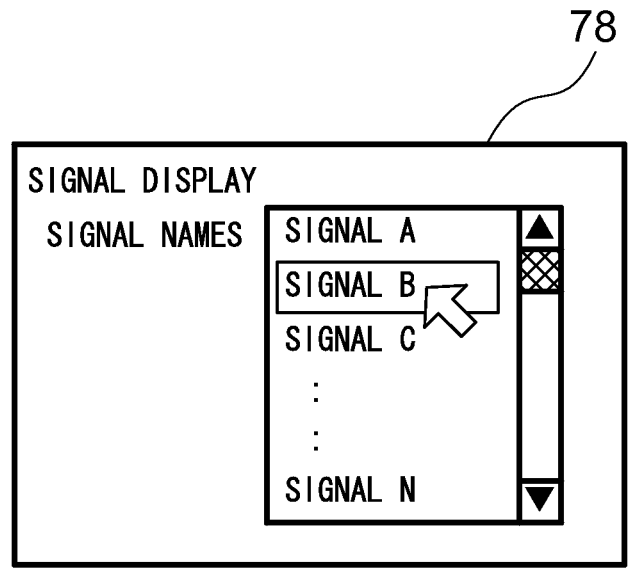
FIG. 9 is a schematic view illustrating an example of a case in which target signal selection possibilities are displayed.

FIG. 8 and FIG. 9 illustrate examples of a display screen of the display 54 when the designation information representing the designation of a target signal is read out. FIG. 8 illustrates a case of displaying a signal line pattern 76 at the display 54. As shown in FIG. 8, the CPU 32 displays the signal line pattern 76 at the display 54 in accordance with the CAD file 50. From the displayed signal line pattern 76 of the multilayer circuit board 64, the user designates a signal line corresponding to the target signal by operating the keyboard 56 and/or the mouse 58. The CPU 32 reads information representing the signal corresponding to the designated signal line to be the designation information representing the target signal.

FIG. 9 illustrates a sub display region 78, in which information representing signals that are used in the multilayer circuit board 64 is selectably displayed at the display 54. As shown in FIG. 9, on the basis of the CAD file 50, the CPU 32 displays signal names of the signals used in the multilayer circuit board 64 at the display 54. From the displayed signal names of the multilayer circuit board 64, the user designates a signal name corresponding to the target signal by operating the keyboard 56 and/or the mouse 58. The CPU 32 reads the information representing the signal corresponding to the designated signal name to be the designation information representing the target signal. In the example illustrated in FIG. 9, a case is described of selection from the displayed signal names of the signals used in the multilayer circuit board 64. However, a signal name may be directly entered as designation information.

Then, when the result of the determination in step 104 is affirmative, in step 106 the CPU 32 reads entry information that is entered by operation of the keyboard 56 and/or the mouse 58. The CPU 32 repeatedly makes a negative determination in step 108 and returns to step 106 until the entry information has been entered by operation of the keyboard 56 and/or the mouse 58. Then, when the result of the determination in step 108 is affirmative, the CPU 32 memorizes the entry information as the ground space determination information 13, and proceeds to the processing of step 110.

Figure 10:
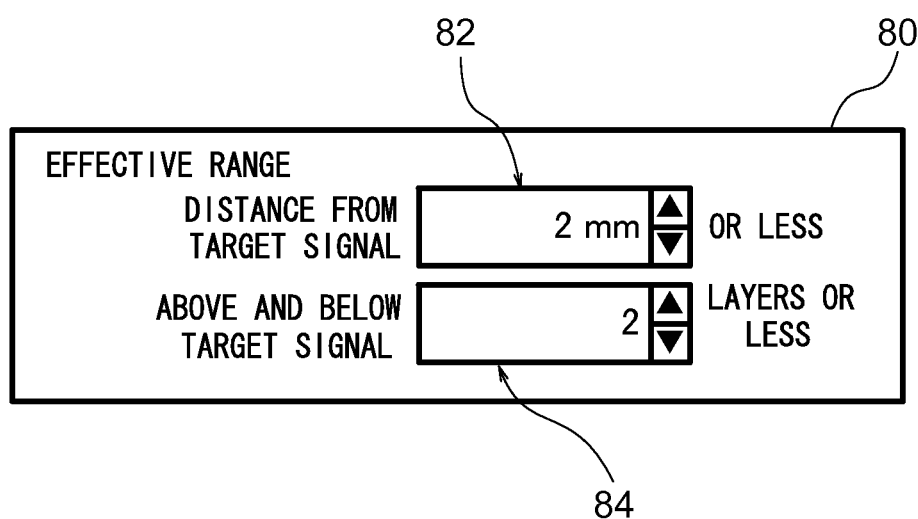
FIG. 10 is a schematic view illustrating an example of ground space determination information.

FIG. 10 illustrates a sub display region 80 of the display 54, depicting an example of ground space determination information that defines a ground space. The ground space determination information 13 is information that prescribes the positions and shapes of the ground space, prescribing the ground space in which a path along which the return current of the target signal flows is to be permitted. FIG. 10 illustrates a case in which, as an example of the ground space determination information 13, information 82, which represents an effective range that is a plan view range of the ground pattern relative to the signal path of the target signal, and information 84, which represents an effective range that is a range of layers, are entered.

In FIG. 10, an example is illustrated in which, as the information 82 representing the plan view range of the ground pattern relative to the signal path of the target signal, a distance from the signal path of the target signal is directly entered by the keyboard 56 or a distance is entered at a pre-specified distance interval (for example, 1 mm units) by operation of the mouse 58. The information 82 representing the plan view range of the ground pattern relative to the signal path of the target signal is not limited to a distance from the signal path of the target signal. For example, as the plan view range of the ground pattern relative to the signal path of the target signal, a polygonal region such as a rectangle, a trapezoid or the like that contains the signal line of the target signal may be entered.

In FIG. 10, an example is illustrated in which, as the information 84 representing a range of layers at the multilayer circuit board 64, a number of layers from the target signal is directly entered by the keyboard 56 or a range of layers is entered at a pre-specified layer interval (for example, one-layer units) by operation of the mouse 58. The information 84 representing the range of layers in the multilayer circuit board 64 is not limited to entry of the same number for layers above and layers below. For example, numbers of layers that are different for layers above and layers below may be entered as the information 84 representing the range of layers in the multilayer circuit board 64.

The ground space determination information is not limited to the entry of the information 82 representing a plan view range of the ground pattern and the information 84 representing a range of layers. The ground space is a space in which the path along which the return current of the target signal flows is to be permitted. Therefore, it is sufficient if the ground space determination information is input information that can define a three-dimensional range relative to the target signal in the multilayer circuit board 64.

Then, after the CPU 32 has executed the acquisition subprogram 40 in accordance with step 102 to step 108, the CPU 32 executes the calculation subprogram 42 included in the path display program 38 by executing the processing of step 110 to step 114 illustrated in FIG. 7. After the CPU 32 has executed the calculation subprogram 42, the CPU 32 executes the display subprogram 48 by executing the processing of step 116. In the calculation subprogram 42 executed by the CPU 32, path information of the target signal is obtained. The calculation subprogram 42 includes the extraction subprogram 44 and the resolution subprogram 46. In the extraction subprogram 44, in step 112, defined regions of the ground are extracted on the basis of the path information of the target signal. In the resolution subprogram 46, in step 114, discontinuity regions are resolved. Also in step 114, assistance information relating to the resolved discontinuity regions is resolved. In the display subprogram 48, in step 116, the resolved discontinuity regions are displayed. Also in step 116 of the display subprogram 48, the resolved assistance information relating to the discontinuity regions is displayed.

First, in step 110, the CPU 32 acquires the CAD file 50 and executes processing to generate the path information of the target signal on the basis of the CAD file 50.

Figure 11:
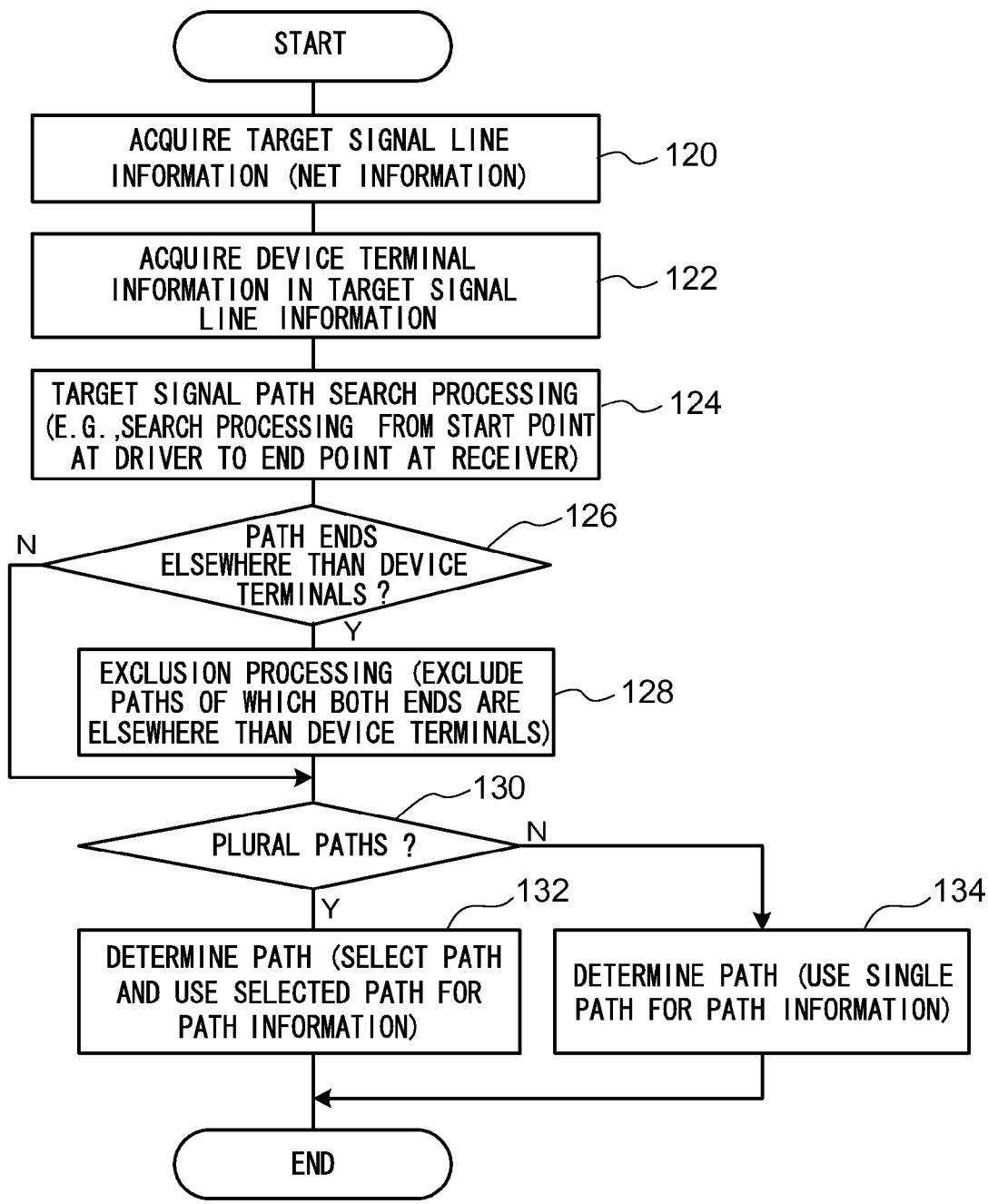
FIG. 11 is a flowchart illustrating an example of the flow of path information generation processing.
Figure 12:
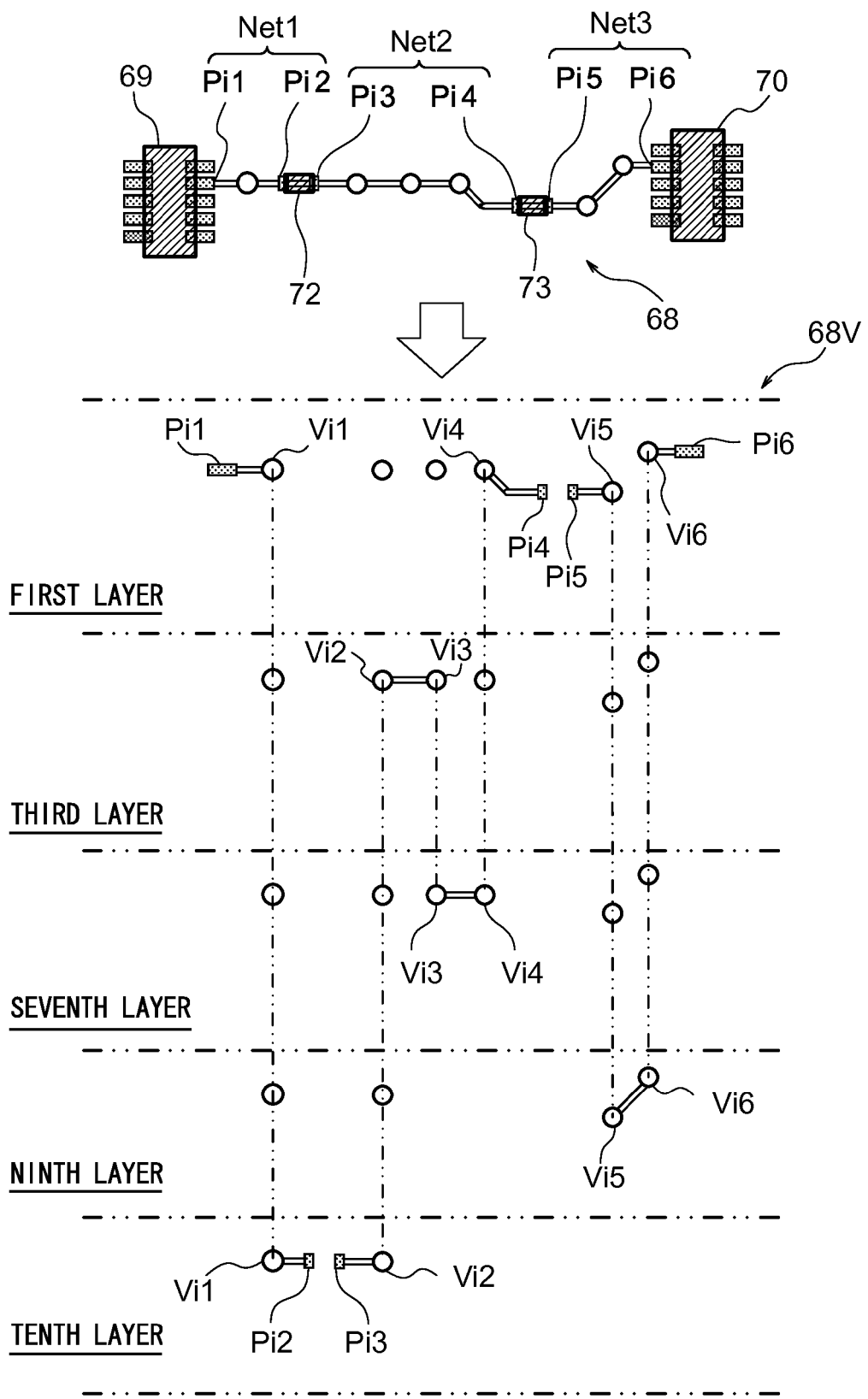
FIG. 12 is a schematic diagram illustrating an example of a signal path of a target signal.

FIG. 11 illustrates an example of the flow of target signal path information generation processing that is executed in step 110. FIG. 12 illustrates, as an example of the signal path of a target signal in the multilayer circuit board 64, the signal path 68 projected in a view of connection relationships between device terminals, and illustrates signal paths 68V in different layers, classified into the respective layers. Similarly to the signal path 68 illustrated in FIG. 5, the signal path 68 illustrated in FIG. 12 represents the path along which current flows from the terminal Pi1 of the driver 69 through the devices to the terminal Pi6 of the receiver 70.

In step 120, the CPU 32 acquires the line information 68H of the target signal. As illustrated by the example of the line information 68H in FIG. 13, for example, the terminal Pi1 of the driver 69 is wired to the via Vi1, and the information "Pi1-Net1-Vi1" is recorded as line information thereof.

In step 122, the CPU 32 acquires information on the device terminals in the line information 68H of the target signal. More specifically, the CPU 32 extracts all terminals of devices included in the line information 68H. Then, in step 124, the CPU 32 executes target signal path search processing. That is, the CPU 32 searches for paths from the start point to the end point of the line of the target signal passing through the devices. In the example illustrated in FIG. 12, the CPU 32 searches for paths from the terminal Pi1 of the driver 69 through the devices to the terminal Pi6 of the receiver 70.

In step 126, the CPU 32 makes a determination as to whether any of the start points and end points of paths obtained as results of the search processing are anywhere other than the device terminals. If the result of the determination is negative, the CPU 32 advances the processing to step 130. On the other hand, if the result of the determination in step 126 is affirmative, the CPU 32 executes exclusion processing in step 128, and then advances the processing to step 130. In the exclusion processing of step 128, of the paths found in step 124, any path whose start point and end point are elsewhere than device terminals is excluded as being an incomplete path, partway through the process of design of the multilayer circuit board 64.

In step 130, the CPU 32 makes a determination as to whether a plural number of paths have been provided by the search processing results, or the search processing results and exclusion processing results. If the result of the determination in step 130 is negative, in step 134 the CPU 32 sets information representing the single path as the path information of the target signal. On the other hand, if the result of the determination in step 130 is affirmative, in step 132 the CPU 32 selects one path from the plural paths and sets information representing the selected single path as the path information of the target signal. The processing to select the path in step 132 automatically selects the path whose path length is longest. Alternatively, the user may select the single path from the plural paths.

When the path information of the target signal has been generated, in step 112 illustrated in FIG. 7, the CPU 32 extracts defined regions from the ground patterns in accordance with the path information of the target signal.

Figure 14:
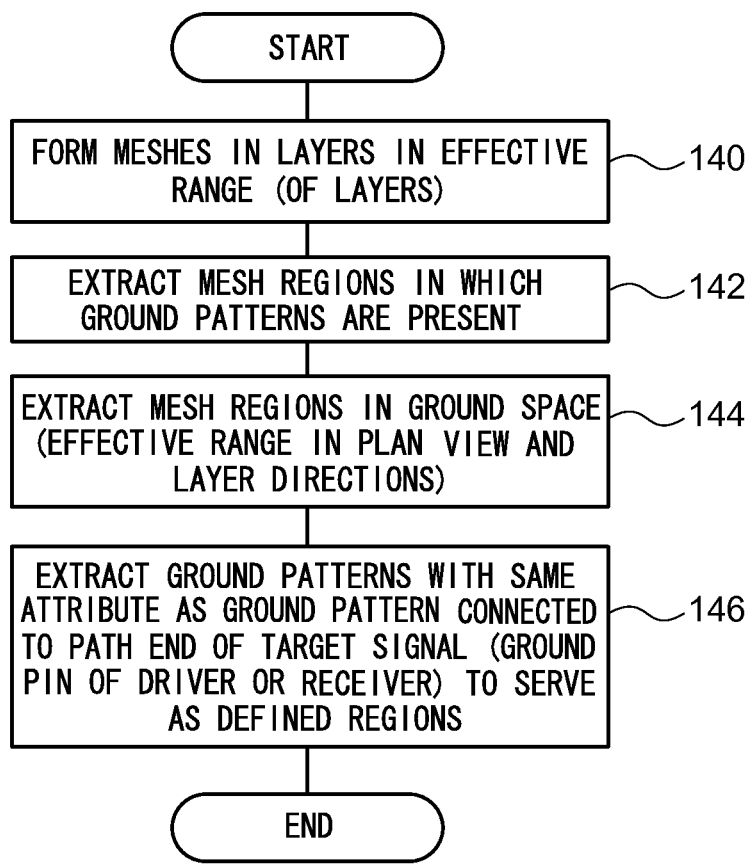
FIG. 14 is a flowchart illustrating an example of the flow of defined region extraction processing.
Figure 15:
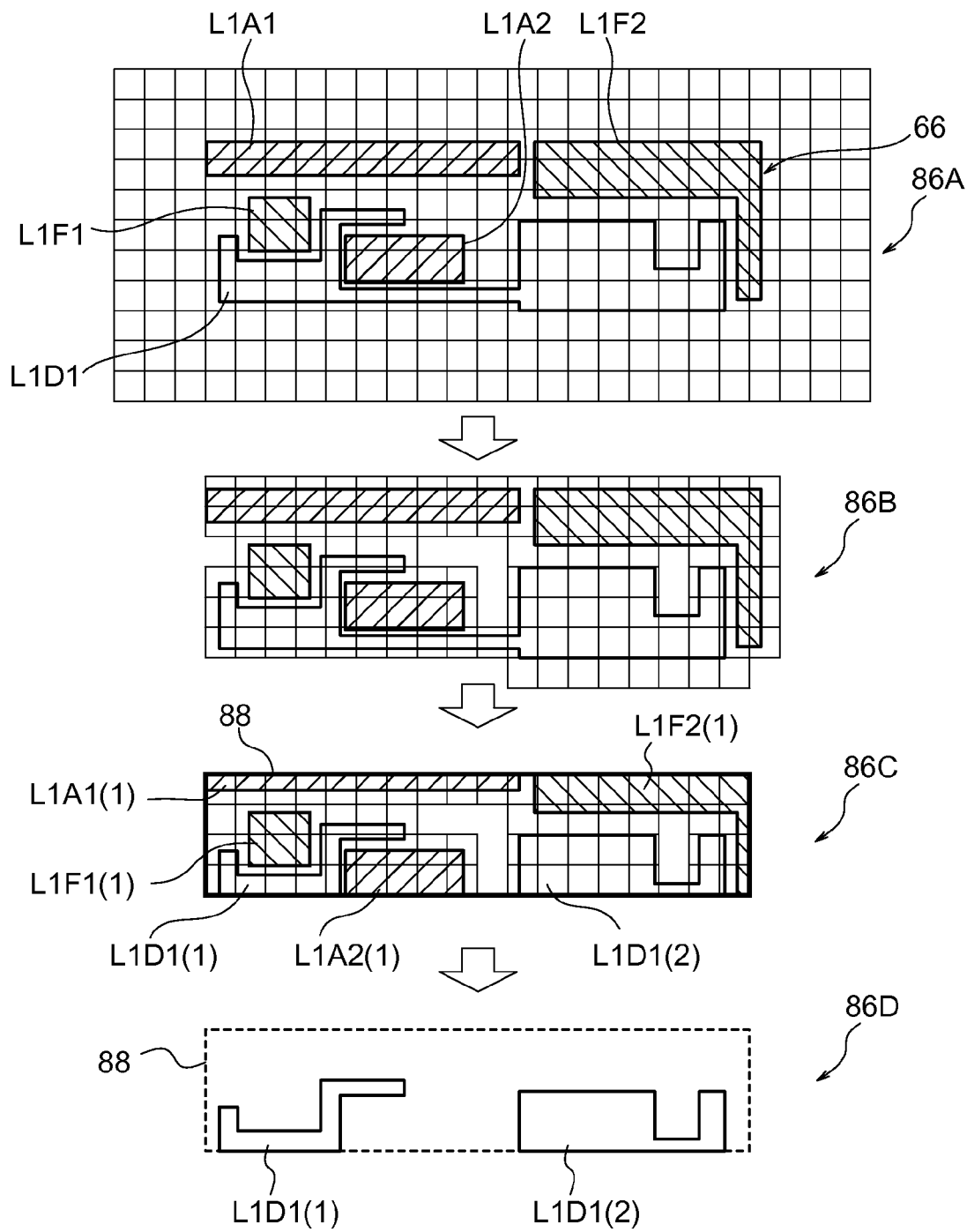
FIG. 15 is a descriptive diagram of processing that extracts defined regions.

FIG. 14 illustrates an example of the flow of processing that extracts defined regions of the ground patterns. FIG. 15 illustrates a descriptive diagram of the processing that extracts the defined regions.

In step 140, the CPU 32 forms a mesh in each layer in the effective range (of layers) in the multilayer circuit board 64 that has been entered as layers above and below the target signal in the ground space determination information 13 defining the ground space. For example, in FIG. 15, the ground pattern 66 of the first layer is divided horizontally and vertically into plural elements (mesh regions), as depicted as a circuit board region 86A. Then, in step 142, the CPU 32 extracts mesh regions in which a ground pattern is present. That is, regions in which a ground pattern is present are extracted from the circuit board region 86A, as depicted as a circuit board region 86B in FIG. 15. In step 144, the CPU 32 extracts mesh regions of the ground patterns that are in, from the ground space determination information 13, the effective range entered as the plan view range and the effective range entered as the range of layers relative to the target signal. That is, as is depicted as a circuit board region 86C in FIG. 15, mesh regions within an effective range 88 are extracted from the circuit board region 86B.

In the circuit board region 86C illustrated in FIG. 15, where portions of patterns are extracted as mesh regions in the effective range 88, parenthetical reference symbols that are numbers indicating the sequence of extraction are assigned to the reference symbols referring to the ground patterns. For example, from the digital ground pattern L1D1, digital ground patterns L1D1(1) and L1D1(2) that are divided in the effective range 88 are extracted. An analog ground pattern L1A1(1) is extracted from the analog ground pattern L1A1 and an analog ground pattern L1 A2(1) is extracted from the analog ground pattern L1A2. Although all of the frame ground pattern L1F1 is contained within the effective range 88, the notation frame ground pattern L1F1 (1) is applied for convenience. A frame ground pattern L1F2(1) is extracted from the frame ground pattern L1F2. Similarly, mesh regions within the effective range 88 are extracted in each of the ground pattern 66 of the third layer, the ground pattern 66 of the seventh layer, the ground pattern 66 of the ninth layer and the ground pattern 66 of the tenth layer.

In step 146, the CPU 32 extracts ground patterns with the same attribute as a ground pattern connected to a path end of the target signal (a ground pin of the driver or receiver) to serve as defined regions. The term "path end of the target signal" refers to the start point and end point of the path along which the return current relating to the path of the target signal flows. In the present exemplary embodiment, digital ground patterns with the same attribute as the digital ground pattern connected to the ground pin of the driver 69 or the receiver 70 are extracted. That is, as depicted as a first layer circuit board region 86D in FIG. 15, the digital ground pattern L1D1 contained within the effective range 88, which is to say each of the divided digital ground patterns L1D1(1) and L1D1(2) within the effective range 88, is extracted to serve as defined regions. Similarly, defined regions are extracted in each of the ground patterns 66 of the third layer, the seventh layer, the ninth layer and the tenth layer.

Thus, the ground space is defined by the entered ground space determination information 13, and ground patterns included in the ground space that have the same attribute as the ground relating to the target signal are extracted to be defined regions.

In the processing that extracts defined regions of the ground, because each layer is meshed, data quantities are reduced compared to simply using data from the CAD file 50.

In the ground defined region extraction processing illustrated in FIG. 14, an example is illustrated in which mesh regions in which ground patterns are present are extracted (step 142), but the processing of step 142 may be omitted. If step 142 is omitted, in step 144, the CPU 32 may collectively extract mesh regions of each layer within the ground space (the effective region in X, Y and Z directions).

After extracting the defined regions, in step 114 illustrated in FIG. 7, the CPU 32 resolves discontinuity regions in the path of the return current relating to the target signal.

Figure 16:
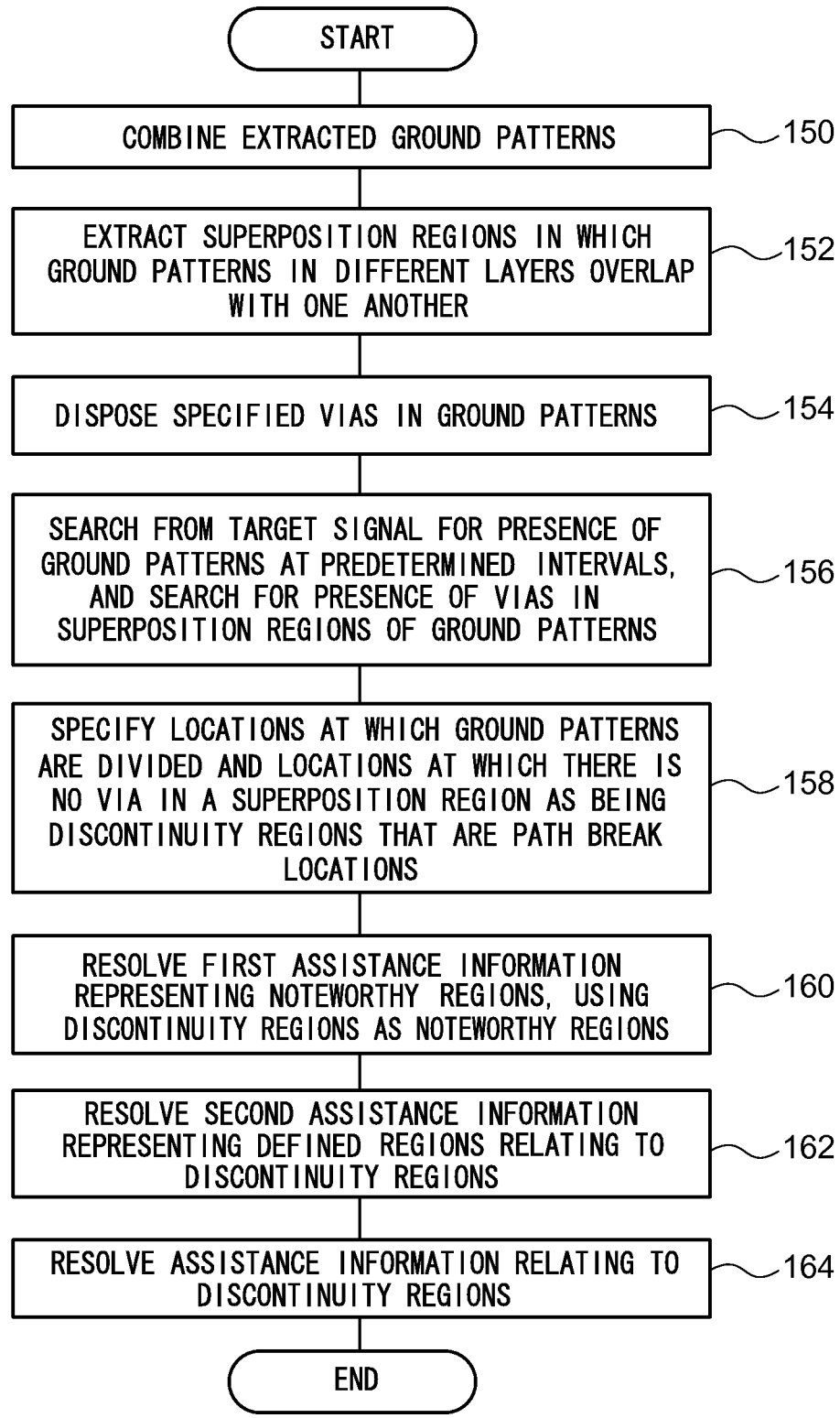
FIG. 16 is a flowchart illustrating an example of the flow of discontinuity region resolution processing.
Figure 17:
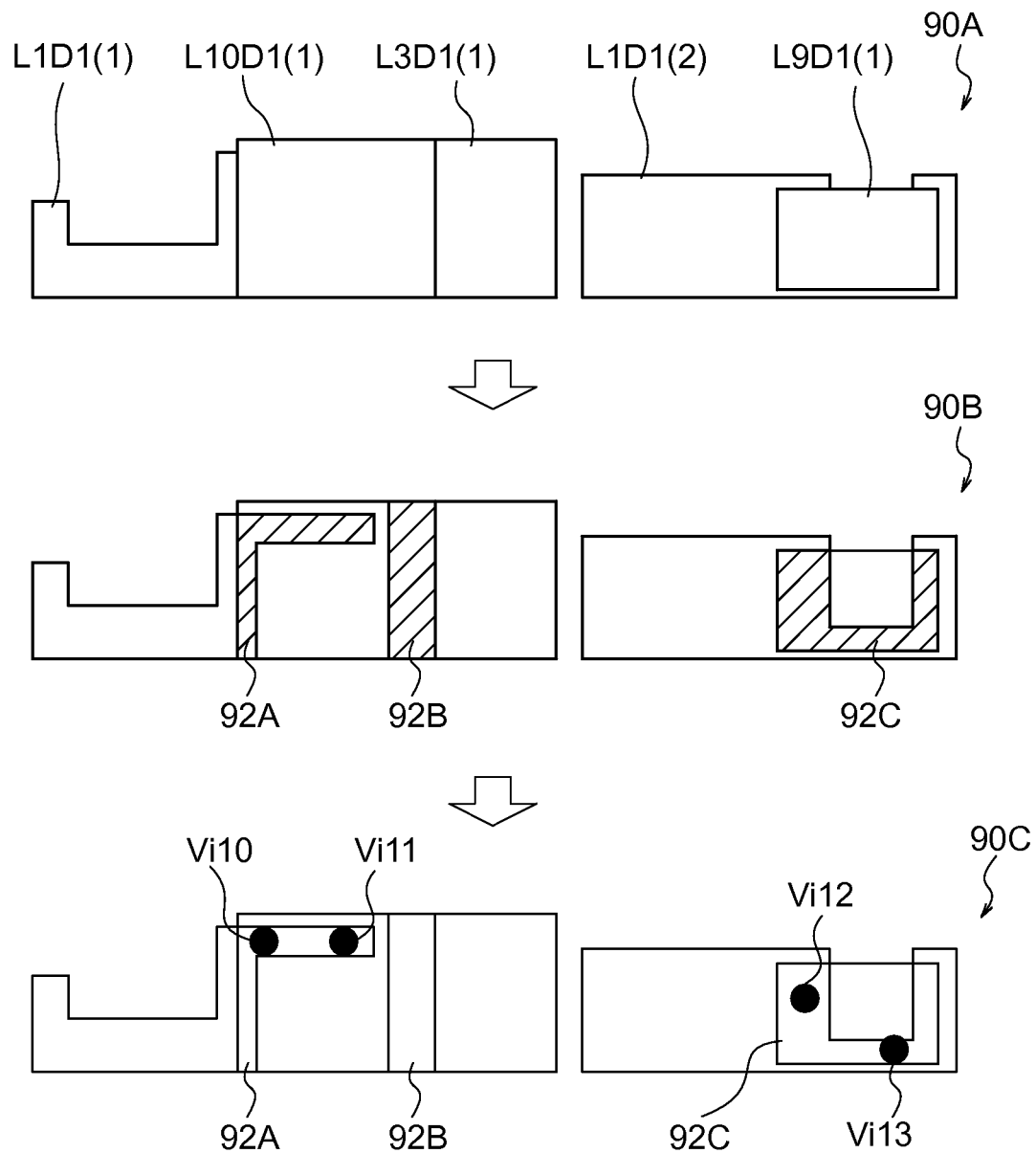
FIG. 17 is a schematic diagram illustrating an example of ground patterns in discontinuity region resolution processing.
Figure 18:
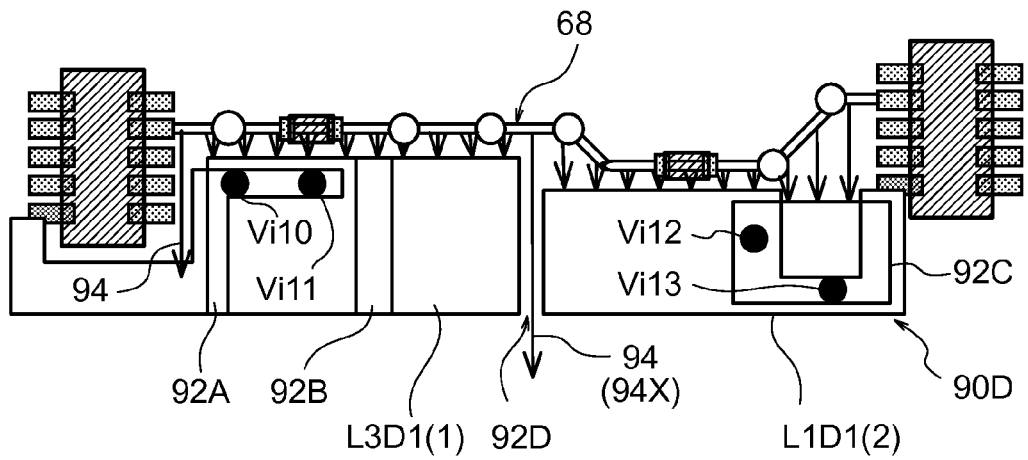
FIG. 18 is a descriptive diagram of a relationship between the path of a target signal and ground patterns.
Figure 19:
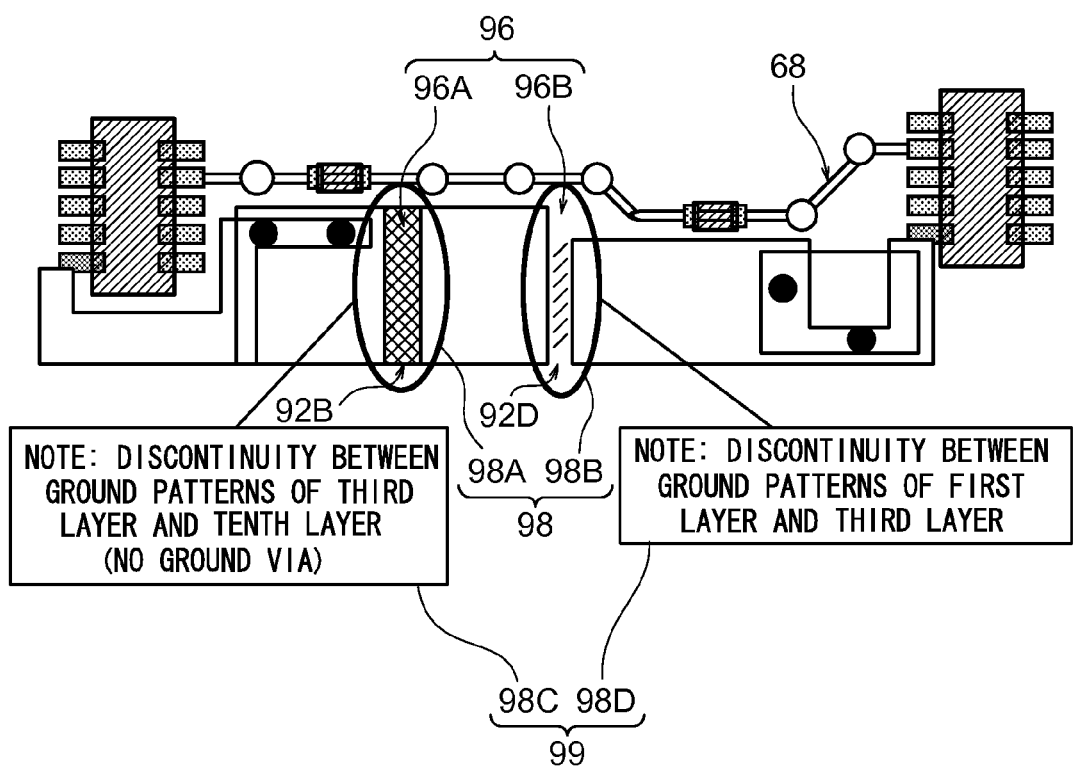
FIG. 19 is a descriptive diagram of processing that resolves assistance information relating to discontinuity regions.

FIG. 16 illustrates an example of the flow of processing that resolves the discontinuity regions. FIG. 17 illustrates an example of ground patterns in the processing that extracts the discontinuity regions. FIG. 18 illustrates an example of a relationship between the path of the target signal and the ground patterns. FIG. 19 illustrates a descriptive diagram of processing that resolves assistance information relating to the discontinuity regions.

In step 150, the CPU 32 combines the defined regions extracted in step 146 illustrated in FIG. 14, that is, the defined regions of the ground patterns included in the layers of the effective region that are included in the ground space. As illustrated by the example of a ground region 90A in FIG. 17, in a case in which the ground pin of the driver 69 or the receiver 70 is connected to a digital ground pattern, digital ground patterns in the first layer, the third layer, the ninth layer and the tenth layer are combined. In other words, the respective digital ground patterns L1D1(1), L1D1(2), L3D1 (1), L9D1(1) and L10D1(1) are superposed.

In step 152, the CPU 32 extracts superposition regions in which the ground patterns in different layers overlap with one another. That is, as illustrated by the example of a ground region 90B in FIG. 17, a superposition region 92A between digital ground pattern L1D1(1) and digital ground pattern L10D1(1) is extracted, and a superposition region 92B between digital ground pattern L10D1(1) and digital ground pattern L3D1(1) is extracted. Similarly, a superposition region 92C between digital ground pattern L1D1(2) and digital ground pattern L9D1(1) is extracted. Then, in step 154, on the basis of the CAD file 50, the CPU 32 disposes any specified vias in the ground patterns in the defined regions. For example, as illustrated by the example of a ground region 90C in FIG. 17, vias Vi10 and Vi11 are disposed in the superposition region 92A, and vias Vi12 and Vi13 are disposed in the superposition region 92C.

In step 156, at intervals of a predetermined spacing, the CPU 32 searches from the signal path of the target signal for the presence of ground patterns. Also in step 156, the CPU 32 searches for the presence of vias in the superposition regions of the ground patterns. That is, as depicted as a ground region 90D in FIG. 18, the CPU 32 searches from the signal path 68 of the target signal for the presence of ground patterns at predetermined intervals along the signal path 68. In FIG. 18, the search for the presence of ground patterns from the signal path 68 is schematically illustrated as arrows 94. In the example illustrated in FIG. 18, because the digital ground patterns L3D1(1) and L1D1(2) are separated, in the search for a ground pattern from the signal path 68 according to arrow 94X, the result that is acquired is a separation region 92D with no ground pattern. In the processing searching for the presence of vias in the superposition regions of the ground patterns, the search results that are obtained are that there is a via in the superposition region 92A and there is a via in the superposition region 92C but there is no via in the superposition region 92B.

In step 158, on the basis of the search results of step 156, the CPU 32 defines locations at which the ground patterns are divided and locations at which there is no via in a superposition region as being path break locations, and specifies the same as discontinuity regions.

When the discontinuity regions are being specified, a region at which a distance between outlines of the defined regions at a location at which the ground patterns are divided is not more than a predetermined value set in advance may be specified as being a discontinuity region. Accordingly, from a number of electronically separated regions at which the ground patterns are divided, candidate regions for the path along which the return current flows are restricted to regions where the distance between the outlines is not more than the predetermined value, and candidate regions for the path along which the return current flows are presented to the user. Further, when the discontinuity regions are being specified, a region in which the distance between the outlines of the defined regions at a location at which there are no vias in a superposition region, which is to say a region in which a distance between layers is not more than a predetermined value set in advance, may be specified as being a discontinuity region.

In step 160, the CPU 32 resolves first assistance information for clarifying the discontinuity regions as being noteworthy regions. The first assistance information is information for clarifying the discontinuity regions to the user. For example, the first assistance information is information that highlights or emphasizes the display of the discontinuity regions and information for attracting attention to the discontinuity regions. Then, in step 162, the CPU 32 resolves second assistance information representing the defined regions that relate to the discontinuity regions. The second assistance information is information for clarifying elements of the discontinuity regions to the user. For example, the second assistance information is information that depicts the ground patterns on which the defined regions that adjoin the discontinuity regions are based. As a further example, the second assistance information is, as the elements constituting the discontinuity regions, information depicting the types of ground patterns that are overlapping, information depicting the overlapping ground patterns, and information depicting the positions of the layers that contain the ground patterns. In step 164, the CPU 32 combines the first assistance information with the second assistance information, thus resolving assistance information relating to the discontinuity regions that contains the first assistance information and the second assistance information.

FIG. 19 illustrates an example of the assistance information. In FIG. 19, as an example of the first assistance information, noteworthy region information 96 that clarifies the discontinuity regions as being noteworthy regions is illustrated. More specifically, the noteworthy region information 96 includes noteworthy region information 96A, which depicts the superposition region 92B of the ground patterns at which no via is provided, and noteworthy region information 96B, which depicts the separation region 92D at which the defined regions are separated. In FIG. 19, as a further example of the first assistance information, marks 98 are illustrated. The marks 98 encircle predetermined regions containing the discontinuity regions in order to clarify the discontinuity regions. The marks 98 include a mark 98A for attracting the attention of the user to the superposition region 92B or the noteworthy region information 96A, and a mark 98B for attracting the attention of the user to the separation region 92D or the noteworthy region information 96B. In FIG. 19, as an example of the second assistance information, message information 99 is illustrated. The message information 99 includes message information 98C and 98D. The message information 98C includes information depicting the ground patterns on which the defined regions adjoining a discontinuity region are based, which is information depicting the positions of the layers in which the ground patterns of the superposition region 92B, in which no via is provided, are disposed. Similarly, the message information 98D includes information depicting the positions of the layers in which the ground patterns adjoining the separation region 92D, at which the ground patterns are separated, are disposed.

When the assistance information has been resolved, in step 116 illustrated in FIG. 7, the CPU 32 displays the discontinuity regions relating to the target signal. In the present exemplary embodiment, the assistance information relating to the discontinuity regions is also displayed in step 116.

Figure 20:
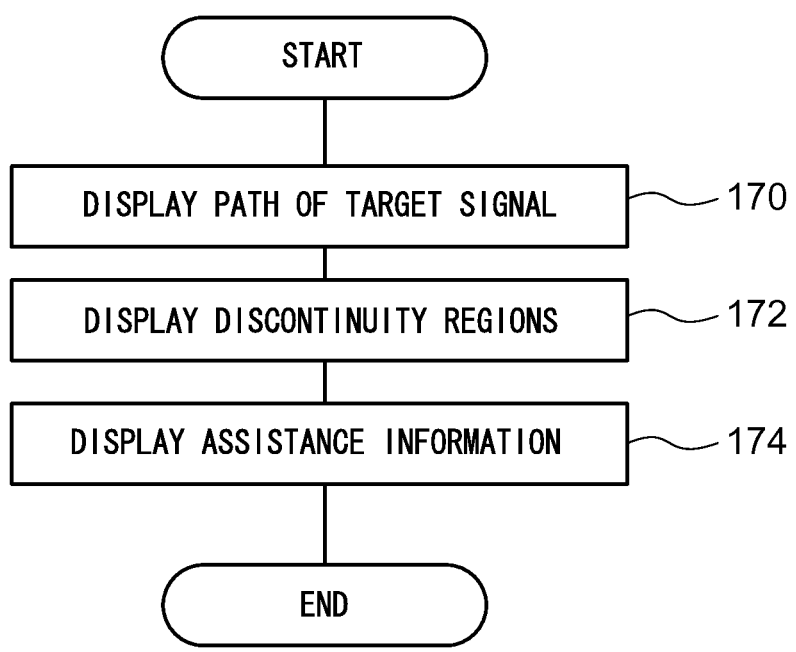
FIG. 20 is a flowchart illustrating an example of the flow of assistance information display processing.

FIG. 20 illustrates an example of the flow of processing that displays the assistance information relating to the discontinuity regions.

In step 170, the CPU 32 displays the signal path 68 of the target signal in the multilayer circuit board 64 at the display 54. Then, in step 172, the CPU 32 displays the discontinuity regions at the display 54, and in step 174, the CPU 32 displays the assistance information at the display 54. Thus, by the display of the discontinuity regions, design of a multilayer circuit board in which electromagnetic field noise is suppressed is assisted. Further, by the display of the discontinuity regions and the assistance information relating to the discontinuity regions, information is presented that may contribute to the design of a multilayer circuit board in which electromagnetic field noise is suppressed. That is, the user may identify discontinuity regions that are predicted to cause occurrences of electromagnetic field noise and, on the basis of the discontinuity regions or the assistance information including the discontinuity regions, design a multilayer circuit board in which electromagnetic field noise is suppressed.

Figure 21:
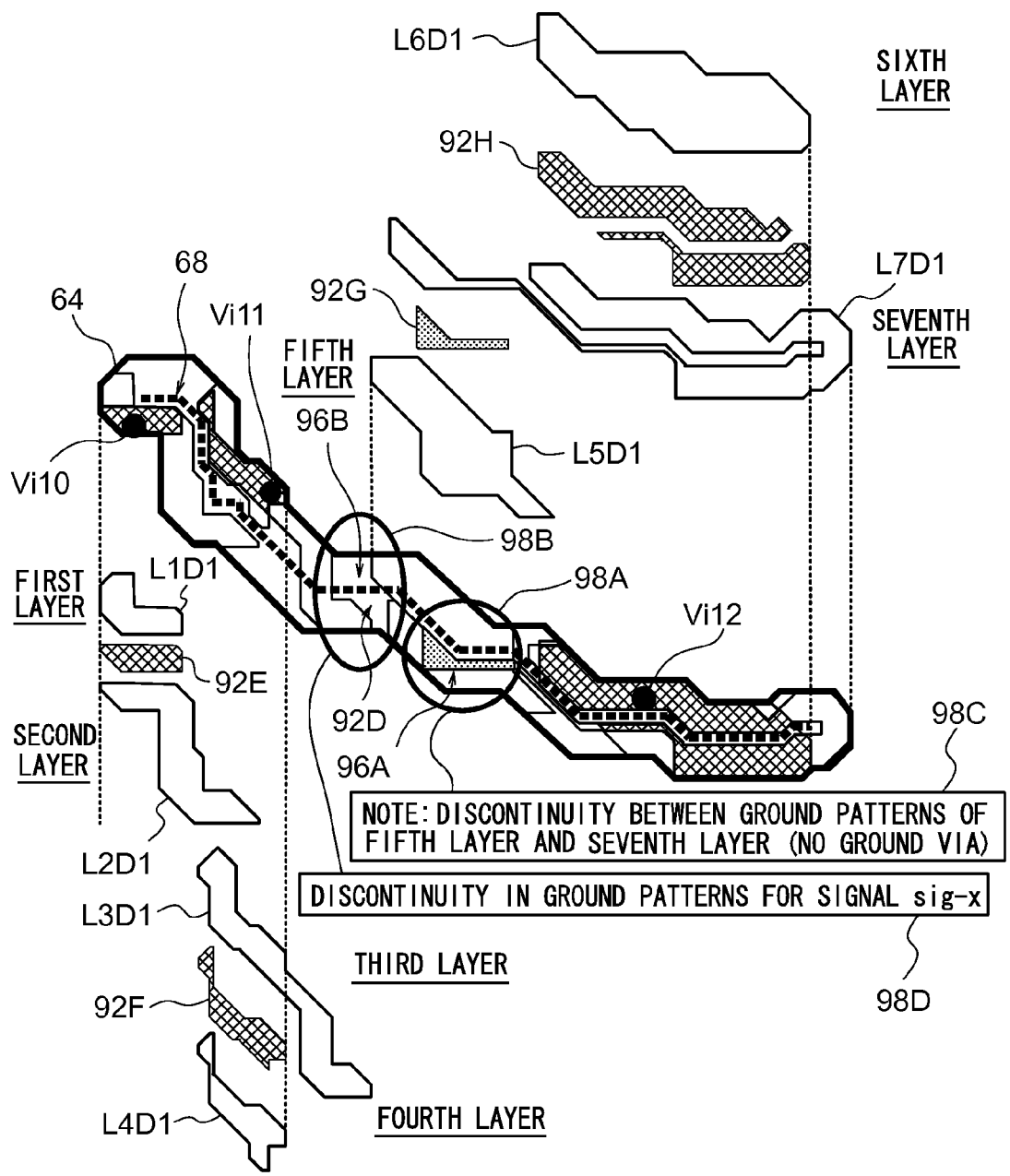
FIG. 21 is a schematic diagram illustrating an example of a multilayer circuit board.

FIG. 21 illustrates a detailed example of the multilayer circuit board 64. The multilayer circuit board 64 illustrated in FIG. 21 includes ground patterns 66 in each of the first to seventh layers. In the example of the multilayer circuit board 64 illustrated in FIG. 21, a ground space to a predetermined distance from the signal path 68 is prescribed. In order to simplify descriptions in FIG. 21, digital ground patterns are taken as the subject, and the digital ground patterns are referred to simply as "ground patterns" in descriptions of FIG. 21.

The ground pattern L1D1 in the first layer and the ground pattern L2D1 in the second layer overlap at a superposition region 92E, and are connected by a via Vi10. The ground pattern L3D1 in the third layer and the ground pattern L4D1 in the fourth layer overlap at a superposition region 92F, and are connected by a via Vi11. The ground pattern L5D1 in the fifth layer and the ground pattern L7D1 in the seventh layer overlap at a superposition region 92G. The ground pattern L6D1 in the sixth layer and the ground pattern L7D1 in the seventh layer overlap at a superposition region 92H, and are connected by a via Vi12. In order to simplify descriptions in FIG. 21, only some of the vias connecting the ground patterns are labelled.

Assistance information that is resolved for the multilayer circuit board 64 illustrated in FIG. 21 includes first assistance information that includes the noteworthy region information 96A and 96B and the marks 98A and 98B. In FIG. 21, the second assistance information includes the message information 98C and 98D. The message information 98C is message information for attracting the user's attention to the superposition region 92G at which no via is provided. The message information 98D is message information for attracting the user's attention to the separation region 92D at which the ground patterns of a signal sig-x are separated.

As described hereabove, in the present exemplary embodiment, on the basis of the CAD file 50, a target signal is designated by the user, and the user enters ground space determination information that prescribes the positions and shapes of a ground space, relative to the path of the target signal, in which a path along which a return current flows is to be permitted. On the basis of the CAD file 50 of the multilayer circuit board 64 and the ground space determination information, regions contained in the ground space prescribed by the ground space determination information are extracted by the computer 30 from ground patterns in the multilayer circuit board to serve as defined regions. From the extracted defined regions, the computer 30 resolves regions that are electronically separated from defined regions that are electronically continuous from a start point of the return current path and from defined regions that are electronically continuous from an end point of the return current path as being discontinuity regions, and displays the discontinuity regions at the display 54. Thus, in the present exemplary embodiment, because the discontinuity regions are displayed, the user identifies the discontinuity regions that are predicted to cause occurrences of electromagnetic field noise and, with consideration for the displayed discontinuity regions, designs a multilayer circuit board that suppresses electromagnetic field noise. Therefore, in the present exemplary embodiment, the design of a multilayer circuit board that suppresses the electromagnet field noise that arises in multilayer circuit boards is assisted by the display of the discontinuity regions.

In the present exemplary embodiment, the computer 30 resolves assistance information relating to the discontinuity regions on the basis of obtained information representing the discontinuity regions. The resolved assistance information is displayed at the display 54. Thus, in the present exemplary embodiment, because the assistance information relating to the discontinuity regions is displayed, the user identifies the discontinuity regions that are predicted to cause occurrences of electromagnetic field noise and, in accordance with the assistance information, designs a multilayer circuit board that suppresses electromagnetic field noise.

Hereabove, an example is described in which the circuit board design assistance device 10 is realized by the computer 30. However, these structures are not limited; numerous improvements and modifications may be applied within a scope not deviating from the gist described above.

Hereabove, a mode is described in which a program is memorized in advance (installed) at the secondary storage section, but the disclosed technology is not limited thus. For example, the program of the disclosed technology may be provided in a mode that is recorded at a non-transient recording medium such as a CD-ROM, a DVD-ROM or the like.

In the present exemplary embodiment, information that prescribes a range of layers in the multilayer circuit board 64 for the signal path 68 of the target signal is used. Therefore, the user may enter ground patterns intuitively in relation to the signal path 68 of the target signal in the multilayer circuit board 64. Furthermore, in the present exemplary embodiment, the information that prescribes the plan view range in the multilayer circuit board 64 and the range of layers in the multilayer circuit board 64 for the signal path 68 of the target signal is used as an example of the ground space determination information. Thus, the user may intuitively enter the positions and shapes of the ground space in relation to the signal path 68 of the target signal in the multilayer circuit board 64.

In the present exemplary embodiment, plural ground patterns in the multilayer circuit board within a predetermined distance from the path of the signal flowing in the multilayer circuit board, in which the plural layers are layered, are extracted from design information of the multilayer circuit board. For the predetermined distance, information entered in the form of information representing a distance is used. Because information representing a distance is used, the plural ground patterns within the multilayer circuit board are easily extracted from the design information of the multilayer circuit board. Furthermore, in the present exemplary embodiment, the ground space determination information is selected from information that prescribes the positions and shapes of plural ground spaces. For example, when a signal path is the target and a ground space is to be prescribed by a plan view range with a certain distance and a range of layers, at least one of the plan view range and the range of layers is made selectable from plural predetermined values defined beforehand. Thus, the user may perform entry by a simple operation of selection without inputting a succession of information to prescribe the positions and shapes of the ground space.

A region that is electronically separated by a distance of not more than a predetermined value from the outline of a first defined region group, of defined regions that are electronically continuous from the start point of a path along which a return current flows, and from the outline of a second defined region group, of defined regions that are electronically continuous from the end point of the path along which the return current flows, is resolved as being a discontinuity region. Thus, candidate regions for the path along which the return current flows, among a number of regions that are electronically separated in the multilayer circuit board 64, are restricted to regions at which the distance between the outlines is not more than the predetermined value, and the candidate regions for the path along which the return current flows are presented to the user.

In the present exemplary embodiment, regions that overlap in the layer direction of the multilayer circuit board 64 and are not connected to one another by a via are found to be discontinuity regions and are displayed as discontinuity regions. Thus, even when the user is not viewing the multilayer circuit board 64 in a transparent plan-type view, the user identifies regions among overlapping regions in the layer direction that are not connected as ground patterns and easily proceeds to operations for suppressing electromagnetic field noise. Further, in the present exemplary embodiment, regions that are separated in the plan view directions of the multilayer circuit board are found to be discontinuity regions and are displayed as discontinuity regions. Thus, the user easily identifies locations at which the ground patterns containing the path along which the return current flows are divided, and easily proceeds to operations for suppressing electromagnetic field noise.

In the present exemplary embodiment, information representing noteworthy regions is resolved to be the assistance information, with the discontinuity regions being the noteworthy regions, and the information representing noteworthy regions is displayed at the display 54. Thus, the discontinuity regions themselves may be displayed to the user and the user may easily identify the discontinuity regions themselves.

In the present exemplary embodiment, as the assistance information, first assistance information representing noteworthy regions is resolved, with the discontinuity regions being the noteworthy regions and second assistance information representing defined regions relating to the discontinuity regions is resolved, and the first assistance information and second assistance information are displayed at the display 54. Thus, regions that are predicted to cause occurrences of electromagnetic field noise are presented to the user with improved noticeability.

Thus, the disclosed technology assists the design of a multilayer circuit board that suppresses the electromagnetic field noise that occurs in multilayer circuit boards in which plural layers are layered.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory recording medium storing a program that causes a computer to execute a circuit board design assistance process comprising:
    extracting, from design information of a multilayer circuit board in which a plurality of layers are layered, a plurality of ground patterns in the multilayer circuit board that are within a predetermined number of layers from a path of a signal that flows in the multilayer circuit board and that are within a predetermined distance from the path of a signal in a plan view direction of the multilayer circuit board;
    based on the design information, resolving a region at which the plurality of extracted ground patterns overlap in a layer direction of the multilayer circuit board or at which the plurality of extracted ground patterns are separated in the plan view direction of the multilayer circuit board or a combination thereof as being a discontinuity region;
    resolving information, that defines the resolved discontinuity region as a noteworthy region, as assistance information relating to the discontinuity region; and
    based on the assistance information, displaying graphically on a display the resolved discontinuity region with the assistance information that are indicated with at least one of highlighting, character description, and a mark.

2. The non-transitory recording medium of claim 1, wherein the predetermined distance includes information entered as information representing a distance.

3. The non-transitory recording medium of claim 1, wherein defined regions that are electronically continuous from a start point of a path along which a return current flows are a first defined region group, defined regions that are electronically continuous from an end point of the path along which the return current flows are a second defined region group, and, of a region that is electronically separated from the first defined region group and the second defined region group, a region in which a distance between outlines of the first defined region group and the second defined region group is not more than a predetermined value is resolved as being the discontinuity region.

4. The non-transitory recording medium of claim 1, wherein the circuit board design assistance process further comprises: on the basis of the resolved discontinuity region, resolving information that includes first assistance information representing a noteworthy region, the noteworthy region being the discontinuity region, and second assistance information representing definition information relating to the discontinuity region to serve as assistance information relating to the discontinuity region.

5. A circuit board design assistance method comprising:
    by a computer, extracting, from design information of a multilayer circuit board in which a plurality of layers are layered, a plurality of ground patterns in the multilayer circuit board that are within a predetermined number of layers from a path of a signal that flows in the multilayer circuit board and that are within a predetermined distance from the path of a signal in a plan view direction of the multilayer circuit board;
    by the computer, based on the design information, resolving a region at which the plurality of extracted ground patterns overlap in a layer direction of the multilayer circuit board or at which the plurality of extracted ground patterns are separated in the plan view direction of the multilayer circuit board or a combination thereof as being a discontinuity region;
    by the computer, based on the assistance information, resolving information, that defines the resolved discontinuity region as a noteworthy region, as assistance information relating to the discontinuity region; and
    by the computer, displaying graphically on a display the resolved discontinuity region with the assistance information that are indicated with at least one of highlighting, character description, and a mark.

6. The circuit board design assistance method of claim 5, further comprising: by the computer, on the basis of the resolved discontinuity region, resolving information that includes first assistance information representing a noteworthy region, the noteworthy region being the discontinuity region, and second assistance information representing definition information relating to the discontinuity region to serve as assistance information relating to the discontinuity region.

7. A circuit board design assistance device comprising:
    a memory configured to store design information of a multilayer circuit board in which a plurality of layers are layered; and
    at least one processor configured to execute a procedure, the procedure comprising:
        extracting, from the design information of the multilayer circuit board, a plurality of ground patterns in the multilayer circuit board that are within a predetermined number of layers from a path of a signal that flows in the multilayer circuit board and that are within a predetermined distance from the path of a signal in a plan view direction of the multilayer circuit board;
        based on the design information, resolving a region at which the plurality of extracted ground patterns overlap in a layer direction of the multilayer circuit board or at which the plurality of extracted ground patterns are separated in the plan view direction of the multilayer circuit board or a combination thereof as being a discontinuity region;

resolving information, that defines the resolved discontinuity region as a noteworthy region, as assistance information relating to the discontinuity region; and based on the assistance information, displaying graphically on a display the resolved discontinuity region with the assistance information that are indicated with at least one of highlighting, character description, and a mark.

8. The circuit board design assistance device of claim 7, wherein the procedure further comprises: on the basis of the resolved discontinuity region, resolving information that includes first assistance information representing a noteworthy region, the noteworthy region being the discontinuity region, and second assistance information representing definition information relating to the discontinuity region to serve as assistance information relating to the discontinuity region.

* * * * *